(12) United States Patent
Chang

(10) Patent No.: US 8,021,972 B1
(45) Date of Patent: Sep. 20, 2011

(54) METHOD OF MANUFACTURING ARRAY SUBSTRATE

(75) Inventor: Hsi-Ming Chang, Taoyuan County (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 0 days.

(21) Appl. No.: 12/954,897

(22) Filed: Nov. 28, 2010

(30) Foreign Application Priority Data

Aug. 26, 2010 (TW) .............................. 99128617 A

(51) Int. Cl.
*H01L 21/00* (2006.01)
(52) U.S. Cl. ........ 438/609; 438/151; 438/637; 438/639; 257/774; 257/749
(58) Field of Classification Search .................. 438/151, 438/609, 637, 639; 247/749, 774
See application file for complete search history.

(56) References Cited

U.S. PATENT DOCUMENTS

| | | | | |
|---|---|---|---|---|
| 5,619,033 A * | 4/1997 | Weisfield | .................... | 250/208.1 |
| 5,641,974 A | 6/1997 | den Boer | | |
| 6,888,597 B2 | 5/2005 | Ha | | |
| 7,023,508 B2 * | 4/2006 | You | ................................ | 349/113 |
| 7,187,001 B2 * | 3/2007 | Kim et al. | ........................ | 257/40 |
| 7,453,537 B2 | 11/2008 | Kim | | |
| 7,531,394 B2 * | 5/2009 | Long et al. | ..................... | 438/155 |
| 7,625,259 B2 * | 12/2009 | Kim et al. | ........................ | 445/23 |
| 7,656,087 B2 * | 2/2010 | Kim et al. | ..................... | 313/509 |
| 7,741,640 B2 * | 6/2010 | Seo et al. | ......................... | 257/59 |

OTHER PUBLICATIONS

Hsi-Ming Chang, Title: Array Substrate, U.S. Appl. No. 12/954,901, filed Nov. 28, 2010.

\* cited by examiner

*Primary Examiner* — Jarrett Stark
*Assistant Examiner* — Nicholas Tobergte
(74) *Attorney, Agent, or Firm* — Winston Hsu; Scott Margo

(57) ABSTRACT

A method of manufacturing an array substrate includes the following steps. A substrate having a thin film transistor disposed thereon is provided. The thin film transistor includes a gate electrode, a gate insulating layer, a source electrode, and a drain electrode. An organic material layer is formed to cover the substrate and the thin film transistor. A via hole is formed in the organic material layer to expose the drain electrode. A first inorganic material layer is formed to cover at least a sidewall of the via hole and a part of the organic material layer, and the first inorganic material layer exposes at least the drain electrode. A patterned transparent pixel electrode layer is formed on the first inorganic material layer, wherein the patterned transparent pixel electrode layer contacts the drain electrode through the via hole.

7 Claims, 10 Drawing Sheets

METHOD OF MANUFACTURING ARRAY SUBSTRATE

BACKGROUND OF THE INVENTION

1. Field of the Invention

The present invention relates to a method of manufacturing an array substrate, and more particularly, to a method of manufacturing an array substrate with a structure to keep transparent electrodes from cracking.

2. Description of the Prior Art

Among current display technologies, liquid crystal displays are widely used in electronic devices because of their advantages, such as light weight, small volume, low power consumption, and radiation-free characteristics.

In general, a plurality of scan lines and a plurality of data lines are disposed on an array substrate of a liquid crystal display panel. The scan lines and the data lines are arranged perpendicular to each other to divide the substrate into a plurality of pixel units. Each of the pixel units has a pixel electrode and a thin film transistor (TFT). The thin film transistor is electrically connected to the scan line and the data line, for being a switching device of the pixel electrode. The pixel electrode, which is used in the substrate of a transmissive liquid crystal display panel and in the transmissive area of a transflective liquid crystal display panel, is made of a transparent conductive material, such as indium tin oxide (ITO).

Generally, there is a planar layer covering the scan lines, the data lines, and the thin film transistors, and then the transparent conductive material is formed on the planar layer as the pixel electrode. Because of the large difference in the coefficients of thermal expansion between the normal material of the planar layer and the transparent conductive material, there will be cracks generated at the area with weaker mechanical structure in the transparent conductive material after thermal treatment of the substrate, such as annealing.

SUMMARY OF THE INVENTION

It is one of the objectives of the present invention to provide a method of manufacturing an array substrate to solve the above-mentioned problem of cracks in the transparent conductive material.

According to a preferred embodiment of the present invention, a method of manufacturing an array substrate comprises: providing a substrate, wherein a thin film transistor is disposed on the substrate, and the thin film transistor comprises a gate electrode, a gate insulating layer, a source electrode, and a drain electrode; forming an organic material layer covering the substrate and the thin film transistor; forming a via hole in the organic material layer to expose the drain electrode; forming a first inorganic material layer, wherein the first inorganic material layer covers at least a sidewall of the via hole and a part of the organic material layer, and the first inorganic material layer exposes at least the drain electrode; and finally, forming a patterned transparent pixel electrode layer on the first inorganic material layer, wherein the patterned transparent pixel electrode layer contacts the drain electrode through the via hole.

According to another preferred embodiment of the present invention, an array substrate comprises: a substrate, wherein a thin film transistor is disposed on the substrate, and the thin film transistor comprises a gate electrode, a gate insulating layer, a source electrode, and a drain electrode; an organic material layer covering the substrate and the thin film transistor; a via hole penetrating the organic material layer and exposing the drain electrode; a first inorganic material layer, covering at least a sidewall of the via hole and a part of the organic material layer and exposing the drain electrode; and a patterned transparent pixel electrode layer disposed on the first inorganic material layer and in the via hole and contacting the drain electrode.

In the present invention, the patterned transparent pixel electrode layer is disposed on the inorganic material layer. Because the coefficients of thermal expansion are similar to each other between the patterned transparent pixel electrode layer and the inorganic material layer, cracks will not be formed in the patterned transparent pixel electrode layer on the inorganic material layer due to temperature variations.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . "

Figure 1:
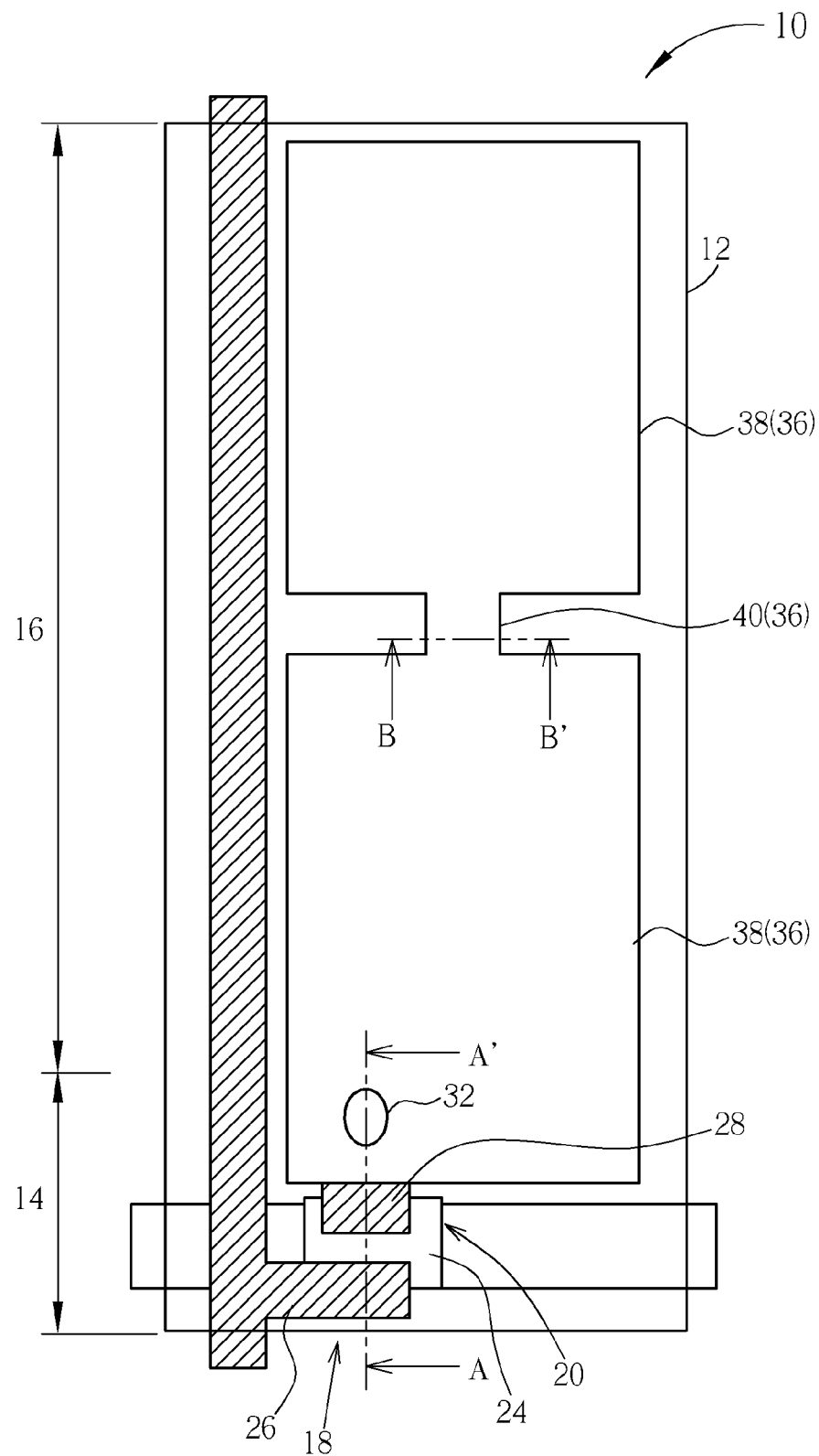
FIG. 1 is a schematic diagram illustrating a top view of an array substrate according to the preferred embodiment of the present invention.
Figure 2:
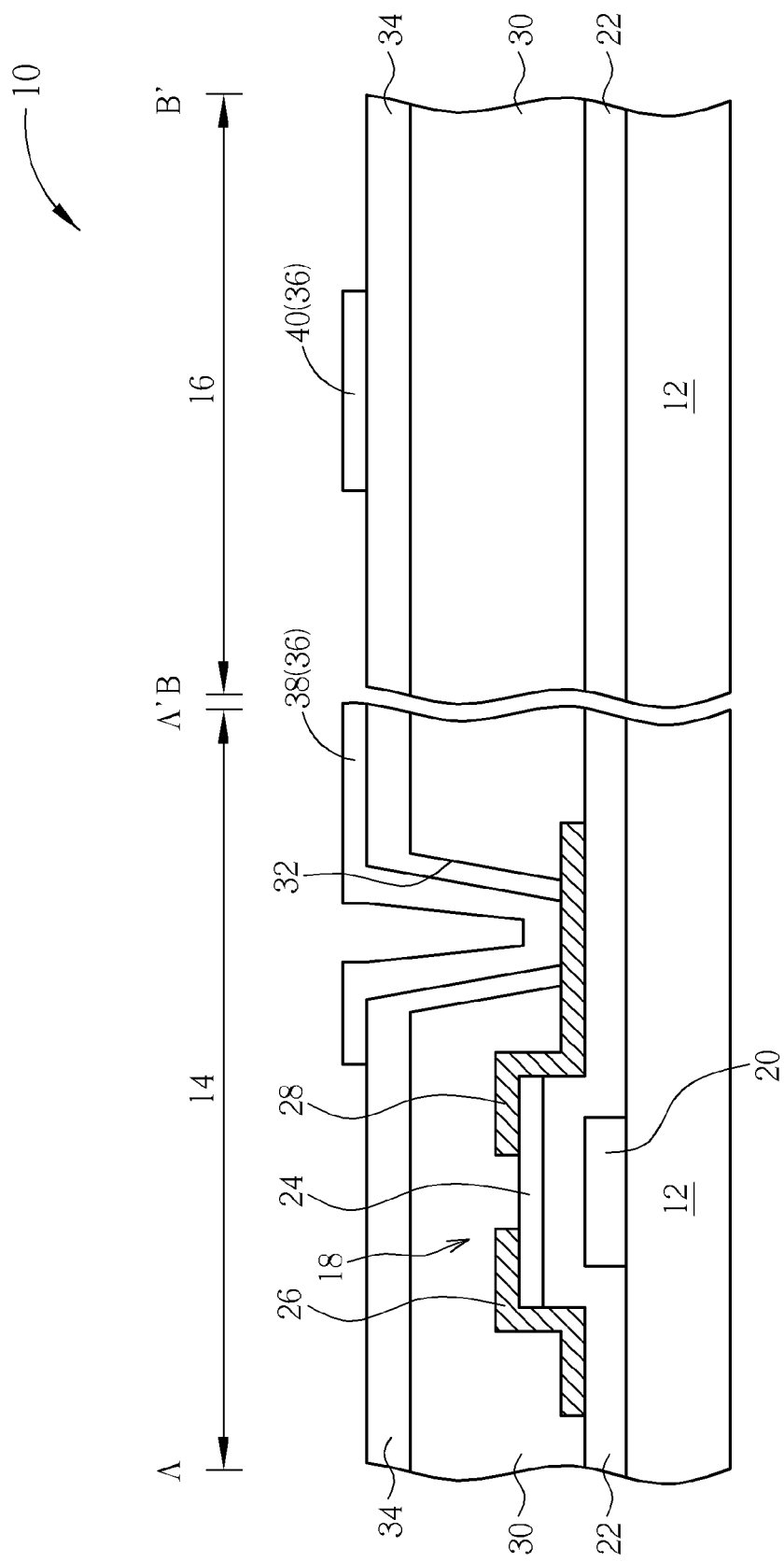
FIG. 2 is a schematic diagram illustrating a cross-sectional view of the array substrate along the line AA' and the line BB' in FIG. 1 according to the first preferred embodiment of the present invention.

FIG. 1 is a schematic diagram illustrating a top view of an array substrate according to the preferred embodiment of the present invention. FIG. 2 is a schematic diagram illustrating a cross-sectional view of the array substrate along the line AA' and the line BB' in FIG. 1 according to the first preferred embodiment of the present invention.

Please refer to FIG. 1 and FIG. 2, an array substrate 10 comprises a substrate 12 divided into a device area 14 and a pixel area 16, wherein a thin film transistor 18 is disposed in the device area 14. The thin film transistor 18 comprises a gate electrode 20, a gate insulating layer 22, which covers the gate electrode 20 and the device area 14 and the pixel area 16 of the substrate 12, a semiconductor layer 24 disposed on the gate insulating layer 22, and a source electrode 26 and a drain electrode 28 disposed on the gate insulating layer 22 and on the semiconductor layer 24. Additionally, the source electrode 26 and the drain electrode 28 are separately disposed on the two sides of the gate electrode 20.

An organic material layer 30, such as organic photo resist, covers the gate insulating layer 22 on the device area 14 of the substrate 12 and the gate insulating layer 22 on the pixel area 16 of the substrate 12. A via hole 32 penetrates the organic material layer 30 to expose the drain electrode 28 through the via hole 32, and the via hole 32 can be a contact hole of the drain electrode 28. A first inorganic material layer 34, such as silicon nitride or silicon oxide, entirely covers the organic material layer 30 on the device area 14 of the substrate 12 and the organic material layer 30 on the pixel area 16 of the substrate 12. The first inorganic layer 34 covers and contacts a sidewall of the via hole 32, and the drain electrode 28 is exposed through the via hole 32. A preferred thickness of the first inorganic material layer 34 is substantially about 3000 angstroms. A patterned transparent pixel electrode layer 36 is disposed on a part of the first inorganic material layer 34 and in the via hole 32 to contact the drain electrode 28. The pattered transparent pixel electrode layer 36 comprises at least two main pixel electrodes 38 and a bridge electrode 40 disposed between and connected to the two main pixel electrodes 38, and a width of the bridge electrode 40 is smaller than a width of each main pixel electrode 38. In addition, the transparent pixel electrode layer 36 can be made of indium tin oxide (ITO) or other transparent conductive materials.

Figure 3:
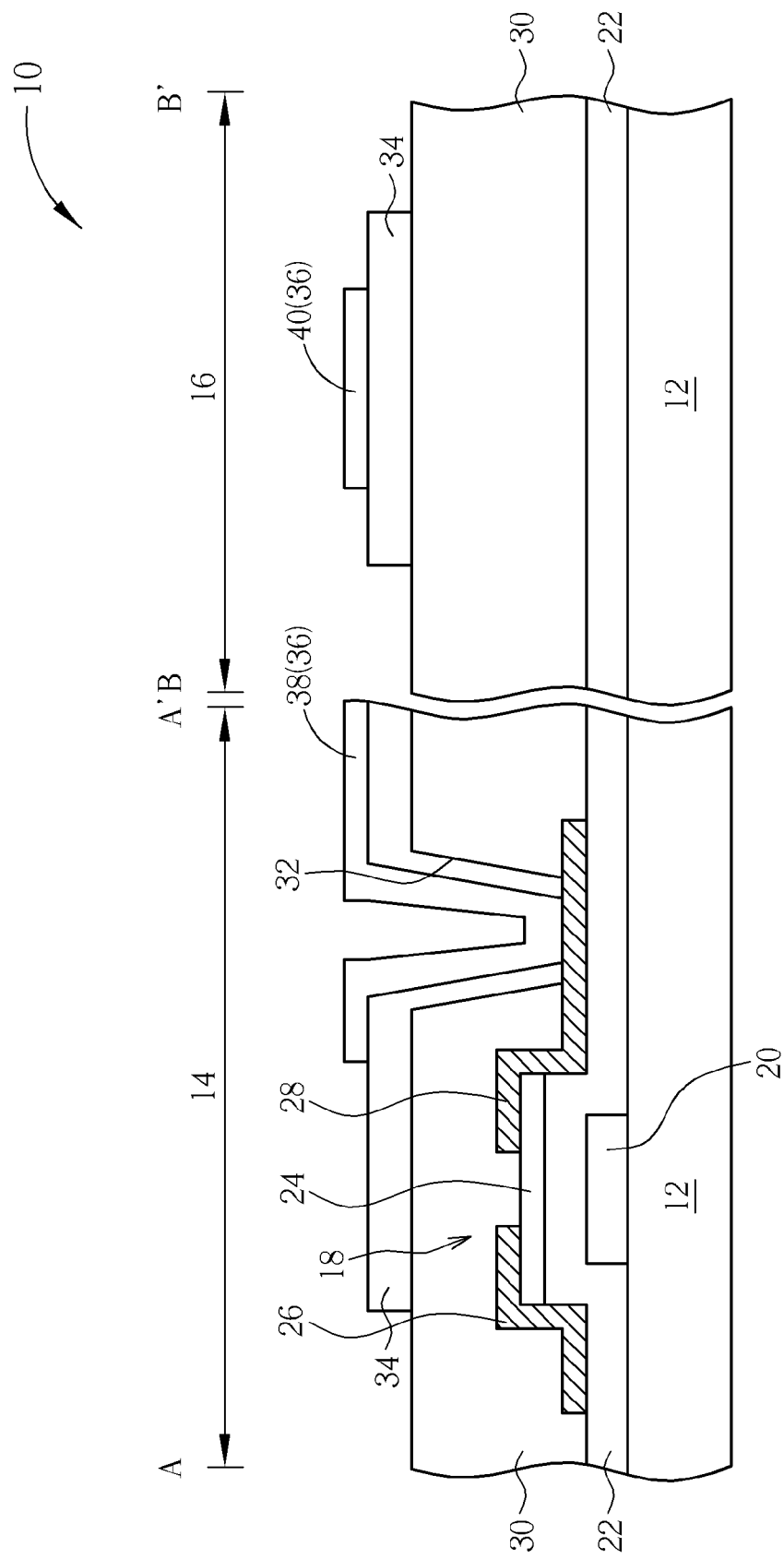
FIG. 3 is a schematic diagram illustrating a cross-sectional view of the array substrate along the line AA' and the line BB' in FIG. 1 according to the second preferred embodiment of the present invention.

FIG. 3 is a schematic diagram illustrating a cross-sectional view of the array substrate along the line AA' and the line BB' in FIG. 1 according to the second preferred embodiment of the present invention. According to the second preferred embodiment of the present invention, the first inorganic material layer 34 can cover only a part of the organic material layer 30 on the device area 14 and the pixel area 16. As shown in FIG. 3, the first inorganic layer 34 is disposed only on the sidewall of the via hole 32, on the organic material layer 30 around the via hole 32, on the organic material layer 30 right under the bridge electrode 40, and on the organic material layer 30 around an area right under the bridge electrode 40. The allocation of other devices on the array substrate of the second preferred embodiment is similar to the first preferred embodiment and will not be redundantly described.

Figure 4:
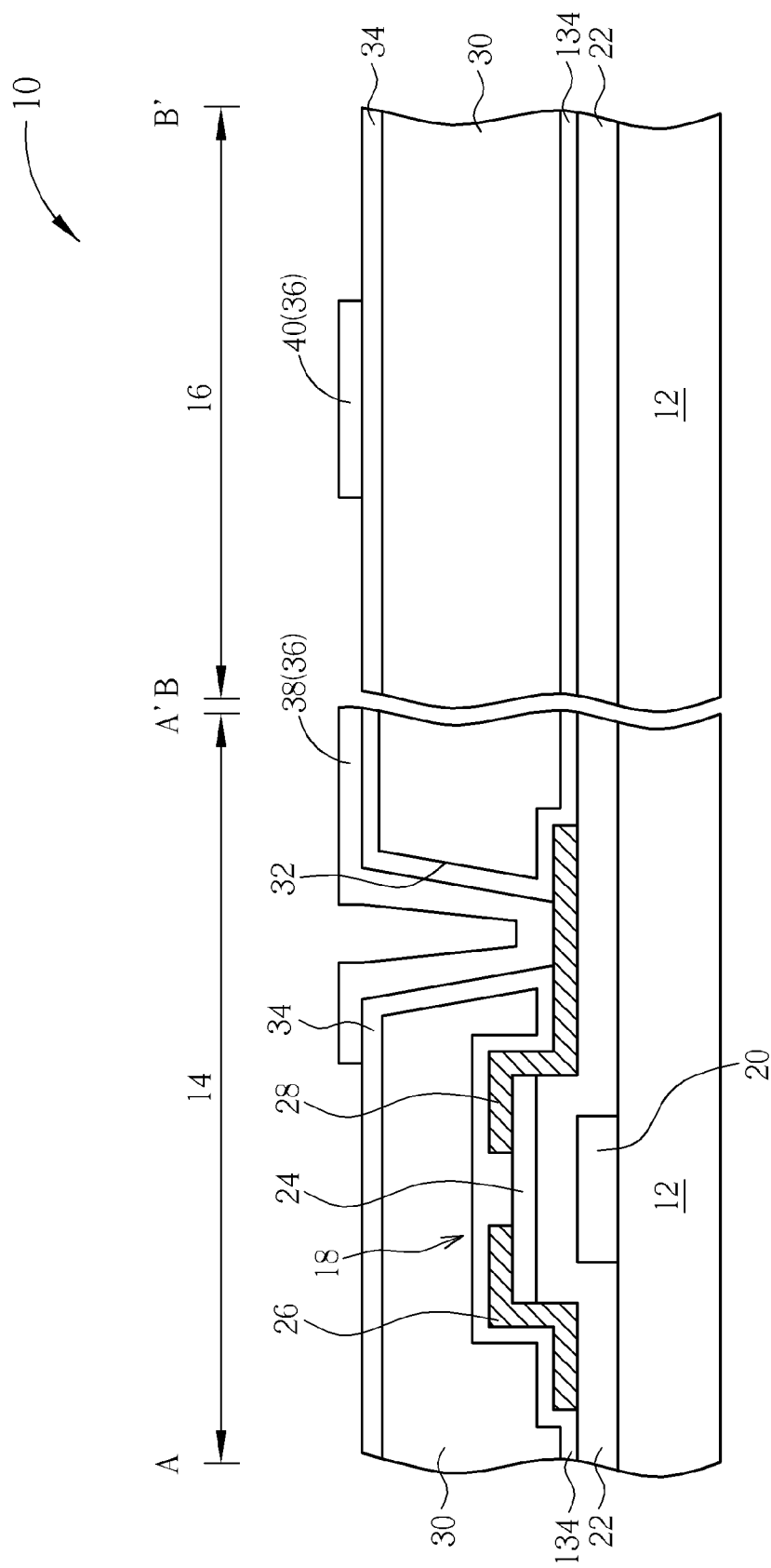
FIG. 4 is a schematic diagram illustrating a cross-sectional view of the array substrate along the line AA' and the line BB' in FIG. 1 according to the third preferred embodiment of the present invention.

FIG. 4 is a schematic diagram illustrating a cross-sectional view of the array substrate along the line AA' and the line BB' in FIG. 1 according to the third preferred embodiment of the present invention, wherein the identical components will be marked with the same symbols. As shown in FIG. 4, the array substrate 10 can further comprise a second inorganic material layer 134 disposed between the gate insulating layer 22 and the organic layer 30 in the device area 14 and the pixel area 16 of the substrate 12, and the second inorganic layer 134 consequently covers the thin film transistor 18. The similarity between the third embodiment and the first embodiment is that a first inorganic material layer 34 entirely covers the organic material layer 30 on the device area 14 and the pixel area 16 of the substrate 12, and the first inorganic material layer 34 covers and contacts the sidewall of the via hole 32.

However, the preferred thickness of the first inorganic material layer in the third preferred embodiment is different from the preferred thickness of the first inorganic material layer in the first preferred embodiment. In the third preferred embodiment, the preferred thickness of the first inorganic material layer 34 and the second inorganic material layer 134 are both substantially about 1500 angstroms, but the present invention is not limited to this. In addition, the first inorganic material layer 34 and the second inorganic material layer 134 can be silicon nitride or silicon oxide, and the allocation of other devices on the array substrate of the third preferred embodiment is similar to the first preferred embodiment and will not be redundantly described.

Figure 5:
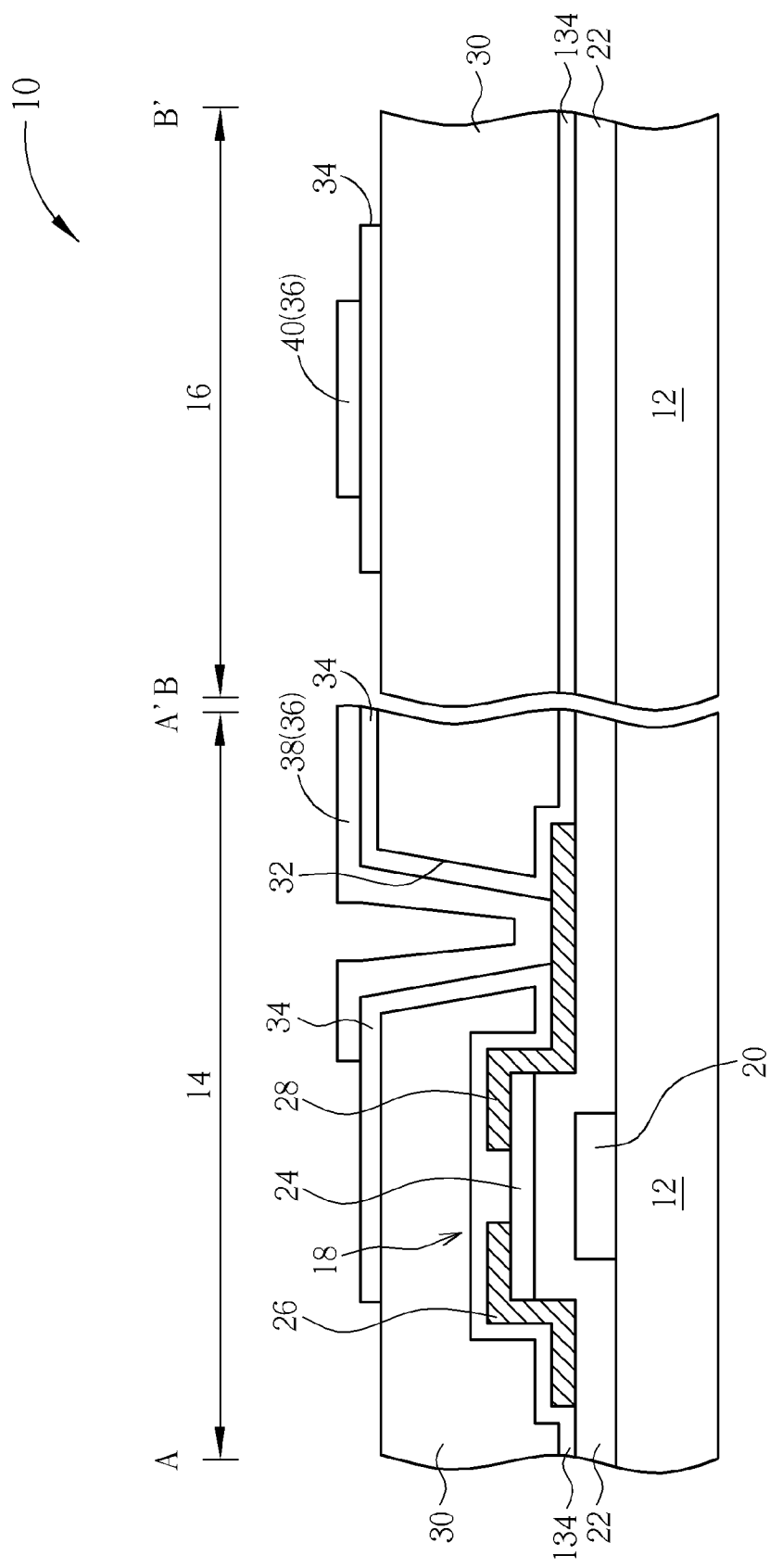
FIG. 5 is a schematic diagram illustrating a cross-sectional view of the array substrate along the line AA' and the line BB' in FIG. 1 according to the fourth preferred embodiment of the present invention.

FIG. 5 is a schematic diagram illustrating a cross-sectional view of the array substrate along the line AA' and the line BB' in FIG. 1 according to the fourth preferred embodiment of the present invention. According to the fourth preferred embodiment of the present invention, the first inorganic material layer 34 can cover only a part of the organic material layer 30 on the device area 14 and the pixel area 16. As shown in FIG. 5, the first inorganic layer 34 is disposed only on the sidewall of the via hole 32, on the organic material layer 30 around the via hole 32, on the organic material layer 30 right under the bridge electrode 40, and on the organic material layer 30 around an area right under the bridge electrode 40. The allocation of other devices on the array substrate of the fourth preferred embodiment is similar to the third preferred embodiment.

Figure 6:
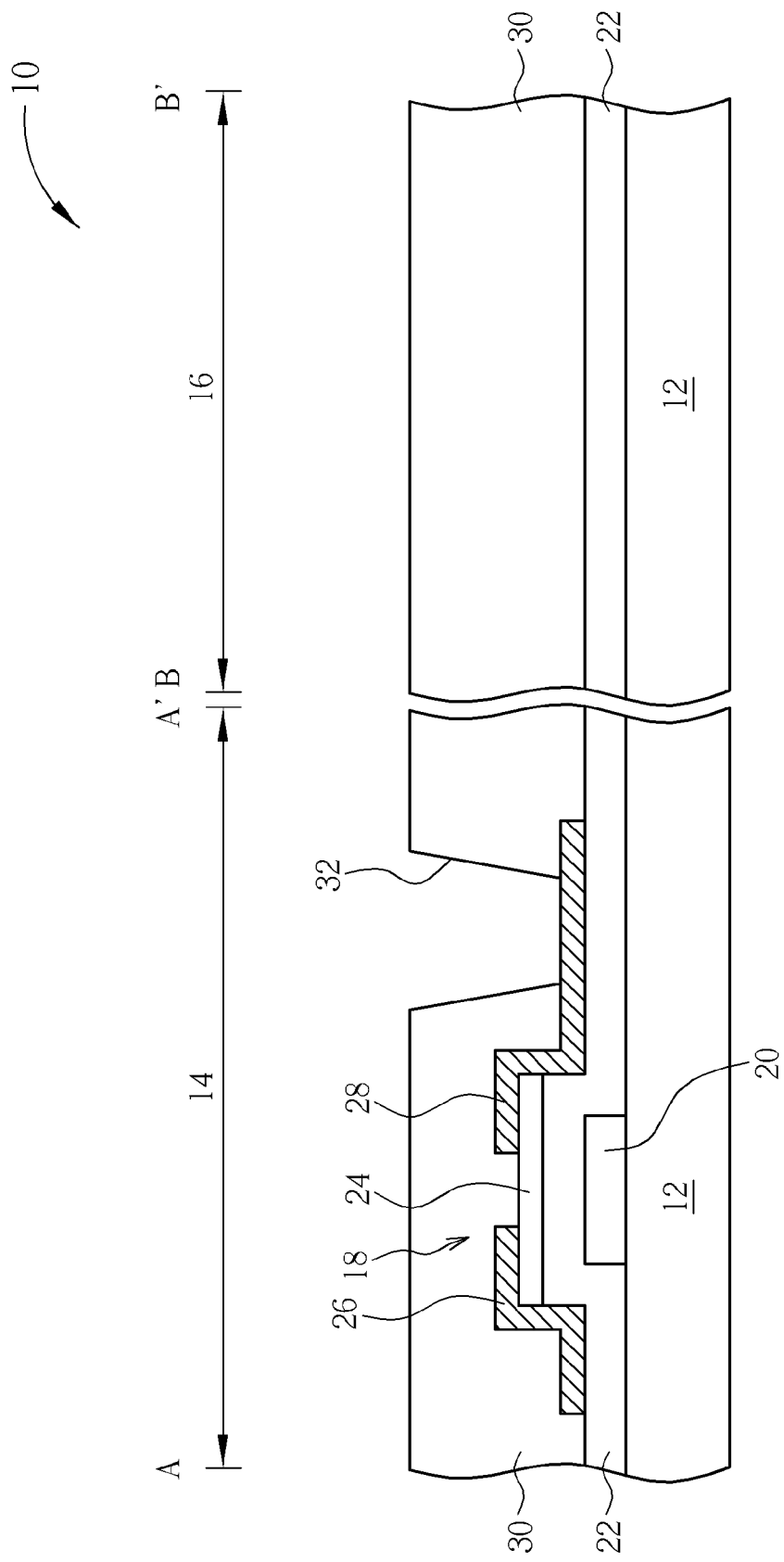
FIGS. 6-10 are schematic diagrams illustrating methods of manufacturing an array substrate in the present invention.
Figure 7:
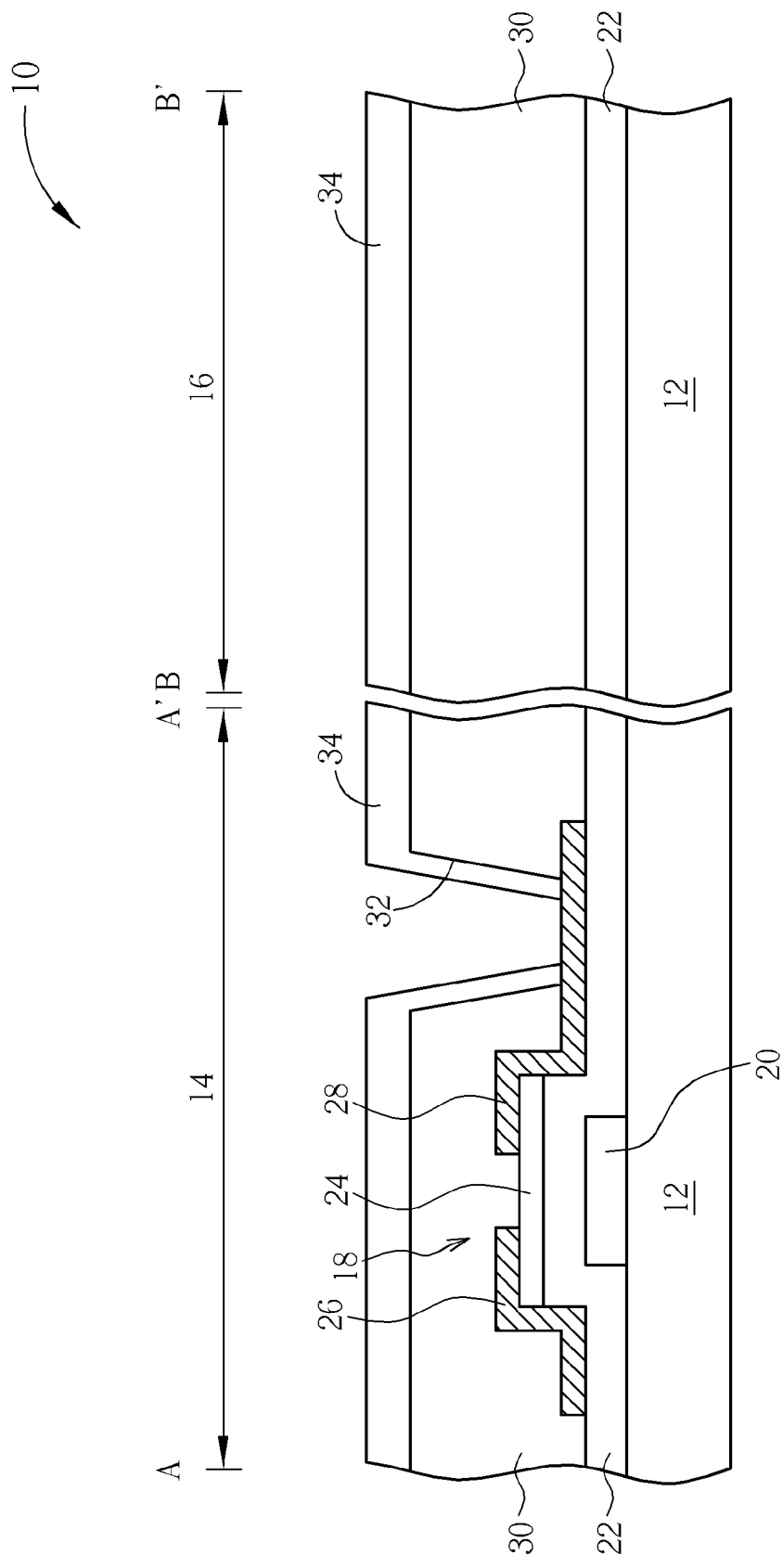

The following description will detail the method of manufacturing an array substrate in the first preferred embodiment and the second preferred embodiment of the present invention as shown in FIG. 6 and FIG. 7, wherein the identical components will be marked with the same symbols. As shown in FIG. 6, firstly a substrate 12 divided into a device area 14 and a pixel area 16 is provided, and a thin film transistor 18 is disposed in the device area 14, wherein the thin film transistor 18 comprises a gate electrode 20, a gate insulating layer 22, which covers the gate electrode 20 and the device area 14 and the pixel area 16 of the substrate 12, a semiconductor layer 24 disposed on the gate insulating layer 22, and a source electrode 26 and a drain electrode 28 disposed on the gate insulating layer 22 and separately disposed on the two sides of the gate electrode 20. Following that, an organic material layer 30 is formed, and the organic material layer 30 entirely covers the substrate 12 and the thin film transistor 18, wherein the preferred material of the organic material layer 30 is an organic photo resist. Then, a via hole 32 is further formed in the organic material layer 30 right over the drain electrode 28 to make the drain electrode 28 exposed through the via hole 32, wherein the via hole 32 can be a contact hole of the drain electrode 28.

As shown in FIG. 7, a first inorganic material layer 34 is formed, and the first inorganic material layer 34 consequently covers the organic material layer 30, the sidewall of the via hole 32, and a part of the drain electrode 28. Then, an etching process is performed to remove a part of the first inorganic material layer 34 over the drain electrode 28 and expose the drain electrode 28. The preferred material of the first inorganic material layer 34 is silicon nitride, and the thickness is substantially about 3000 angstroms.

Please refer to FIG. 2. After completing the process of etching the first inorganic material layer 34, a patterned transparent pixel electrode layer 36 is then formed on the first inorganic material layer 34. The patterned transparent pixel electrode layer 36 is disposed on the surface of the first inorganic material layer 34 and on the first inorganic material layer 34 over the sidewall of the via hole 32. The patterned transparent pixel electrode 36 contacts the drain electrode 28. Additionally, the patterned transparent pixel electrode layer 36 comprises at least two main electrodes 38 and a bridge electrode 40. The bridge electrode 40 is disposed between the two main pixel electrodes 38 and connected to the two main pixel electrodes 38, and the width of the bridge electrode is smaller than the width of each main pixel electrode 38. The patterned transparent pixel electrode layer 36 can be indium tin oxide (ITO) or other transparent conductive materials. Then the array substrate in the first preferred embodiment of the present invention is completed.

There is only a little difference between the method of manufacturing the array substrate in the second preferred embodiment and the method of manufacturing the array substrate in the first preferred embodiment. According to the array substrate 10 in the second preferred embodiment, a part of the first inorganic material layer 34 on the surface of the organic layer 30 needs to be removed during the process, which removes the first inorganic material layer 34 on the drain electrode 28, as shown in FIG. 7. The first inorganic material layer 34 only remains on the organic material layer 30 over the sidewall of the via hole 32, on the organic material layer 30 around the via hole 32, on the organic material layer 30 right under the bridge electrode 40, and on the organic material layer 30 around an area right under the bridge electrode 40. Then, the patterned transparent pixel electrode 36 is formed, as in the process described in the first preferred embodiment, to form the array substrate 10 shown in FIG. 3.

Figure 8:
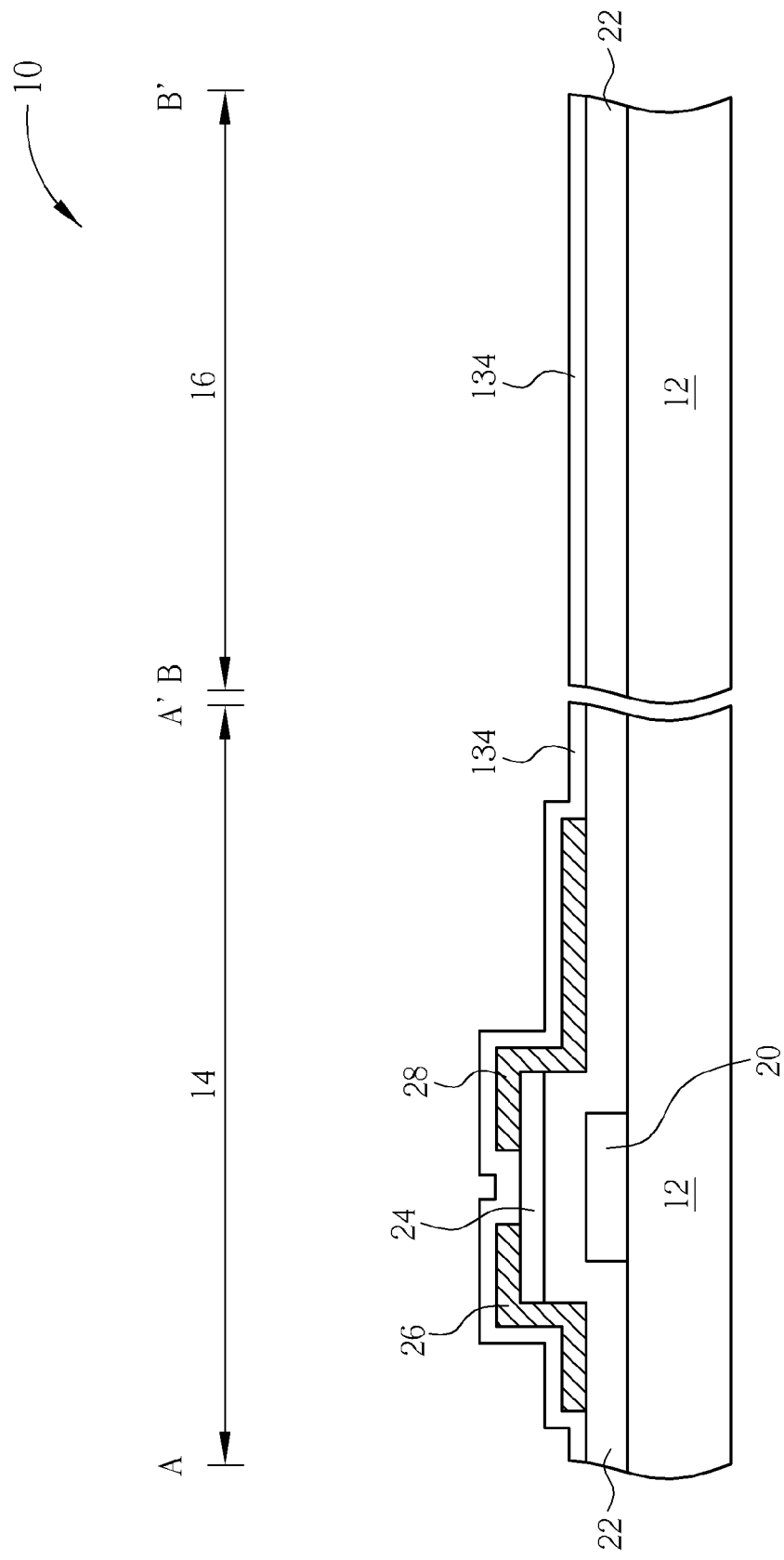
Figure 9:
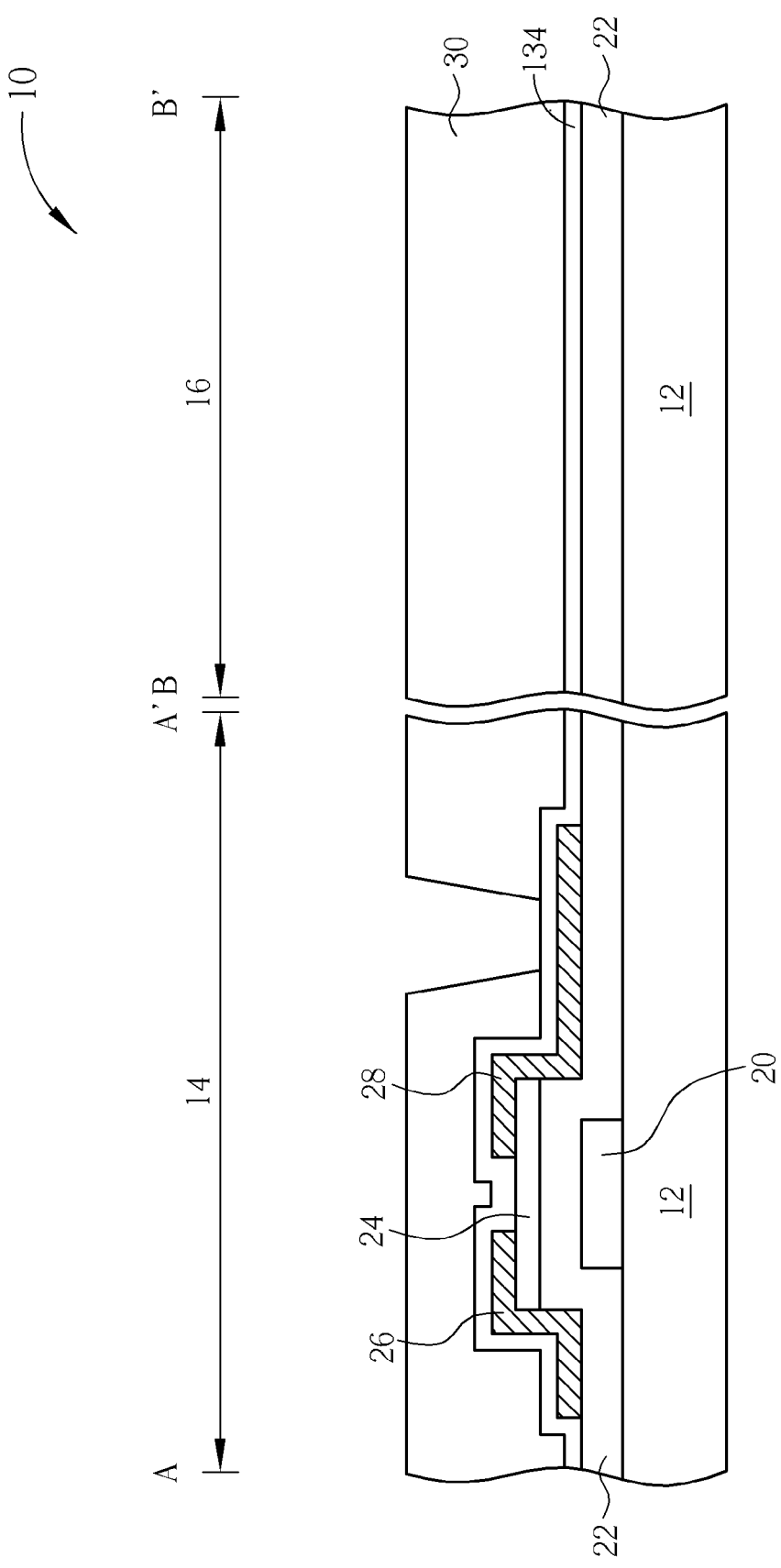
Figure 10:
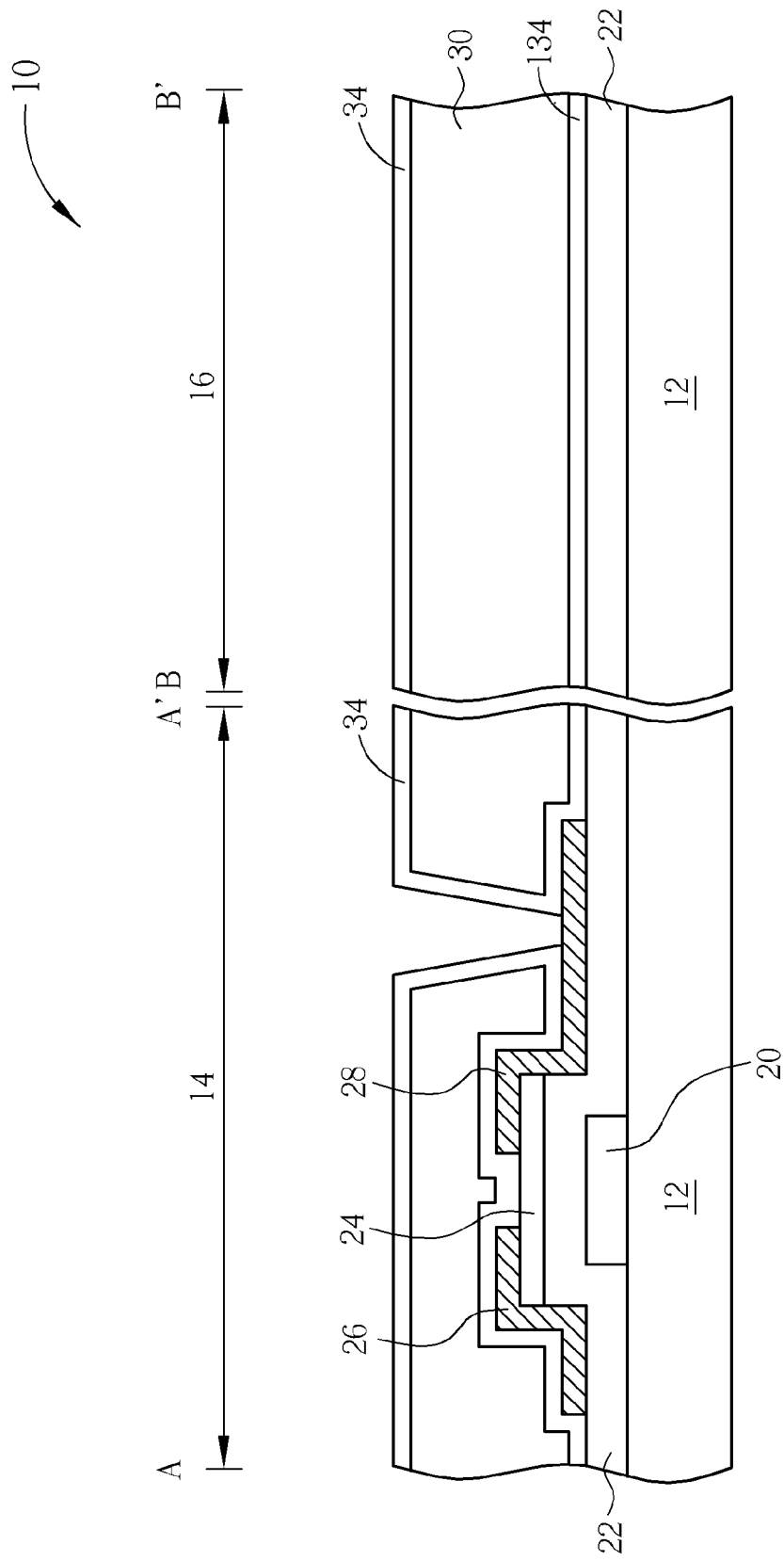

The following description will detail the method of manufacturing an array substrate in the third preferred embodiment and the fourth preferred embodiment of the present invention as shown in FIGS. 8-10, wherein the identical components will be marked with the same symbols. As shown in FIG. 8, firstly a substrate 12 divided into a device area 14 and a pixel area 16 is provided, and a thin film transistor 18 is disposed in the device area 14, wherein the thin film transistor 18 comprises a gate electrode 20, a gate insulating layer 22, which covers the gate electrode 20 and the device area 14 and the pixel area 16 of the substrate 12, a semiconductor layer 24 disposed on the gate insulating layer 22, and a source electrode 26 and a drain electrode 28 disposed on the gate insulating layer 22 and separately disposed on the two sides of the gate electrode 20. Following that, a second inorganic material layer 134 is formed, and the second inorganic material layer 134 entirely covers the device area 14 and the pixel area 16 of the substrate 12 and entirely covers the thin film transistor 18. According to the preferred embodiment of the present invention, the second inorganic material layer 134 is silicon nitride or silicon oxide, and the preferred thickness of the second inorganic material layer 134 is substantially about 1500 angstroms.

As shown in FIG. 9, an organic material layer 30 is formed, and the organic material layer 30 entirely covers the second inorganic material layer 134 in the device area 14 and in the pixel area 16. Then, a via hole 32 is further formed in the organic material layer 30 right over the drain electrode 28, to expose the second inorganic material layer 134 through the via hole 32. As shown in FIG. 10, a first inorganic material layer 34 is formed and the first inorganic material layer 34 consequently covers the organic material layer 30, the sidewall of the via hole 32, and a part of the second inorganic material layer 34. Then, an etching process is performed to remove a part of the first inorganic material layer 34 and a part of the second inorganic material layer 134 over the drain electrode 28, and the drain electrode 28 is exposed.

As shown in FIG. 4, a patterned transparent pixel electrode layer 36 is then formed on the first inorganic material layer 34. The patterned transparent pixel electrode layer 36 is disposed at least on a part of the surface of the first inorganic material layer 34 and on the first inorganic material layer 34 over the sidewall of the via hole 32. The patterned transparent pixel electrode layer 36 contacts the drain electrode 28. In addition, the patterned transparent pixel electrode layer 36 comprises at least two main electrodes 38 and a bridge electrode 40. The bridge electrode 40 is disposed between the two main pixel electrodes 38 and connected to the two main pixel electrodes 38, and the width of the bridge electrode is smaller than the width of each main pixel electrode 38. The patterned transparent pixel electrode layer 36 can be indium tin oxide (ITO) or other transparent conductive materials. Then the array substrate 10 in the third preferred embodiment of the present invention is completed.

There is only a little difference between the method of manufacturing the array substrate in the fourth preferred embodiment and the method of manufacturing the array substrate in the third preferred embodiment. According to the array substrate 10 in the fourth preferred embodiment, a part of the first inorganic material layer 34 on the surface of the organic layer 30 needs to be removed during the process, which removes the first inorganic material layer 34 and the second inorganic material layer 134 on the drain electrode 28. And the first inorganic material layer 34 only remains on the organic material layer 30 over the sidewall of the via hole 32, on the organic material layer 30 around the via hole 32, on the organic material layer 30 right under the bridge electrode 40, and on the organic material layer 30 around an area right under the bridge electrode 40. Then, the patterned transparent pixel electrode 36 is formed, as the process described in the third preferred embodiment, to form the array substrate 10 shown in FIG. 5.

In the present invention, an inorganic material layer, such as silicon nitride, is disposed under the patterned transparent pixel electrode layer. The inorganic material layer is disposed especially on the sidewall of the via hole, on the organic material layer around the via hole and on the organic material under the bridge electrode, to keep the patterned transparent pixel electrode from directly contacting the organic material layer. Additionally, the normal patterned transparent pixel electrode is indium tin oxide (ITO), and the respective coefficients of thermal expansion for indium tin oxide (ITO) and silicon nitride are similar to each other. Therefore, by disposing an inorganic material layer under the patterned transparent pixel electrode, cracks in the patterned transparent pixel electrode layer on the inorganic material layer will not be generated by temperature variations, and the completeness of the patterned transparent pixel electrode on the sidewall of the via hole and under the bridge electrode can be especially maintained.

Those skilled in the art will readily observe that numerous modifications and alterations of the device and method may be made while retaining the teachings of the invention.

What is claimed is:

1. A method of manufacturing an array substrate, comprising:
    providing a substrate, wherein a thin film transistor is disposed on the substrate, and the thin film transistor comprises a gate electrode, a gate insulating layer, a source electrode, and a drain electrode;
    forming an organic material layer, covering the substrate and the thin film transistor;
    forming a via hole in the organic material layer to expose the drain electrode;
    forming a first inorganic material layer, wherein the first inorganic material layer includes silicon nitride or silicon oxide, the first inorganic material layer covers at least a sidewall of the via hole and a part of the organic material layer, and the first inorganic material layer exposes at least the drain electrode; and
    forming a patterned transparent pixel electrode layer on the first inorganic material layer, wherein the patterned transparent pixel electrode layer contacts the drain electrode through the via hole.

2. The method of manufacturing the array substrate in claim 1, wherein the patterned transparent pixel electrode layer comprises at least two main pixel electrodes and a bridge electrode, the bridge electrode is disposed between the two main pixel electrodes and connected with the two main pixel electrodes, and a width of the bridge electrode is smaller than a width of the two main pixel electrodes.

3. The method of manufacturing the array substrate in claim 2, wherein the first inorganic material layer is disposed on the organic material layer around the via hole, right under the bridge electrode, and on the organic material layer around a area right under the bridge electrode.

4. The method of manufacturing the array substrate in claim 1, wherein the first inorganic material layer exposes the drain electrode of the thin film transistor by using an etching process.

5. The method of manufacturing the array substrate in claim 4, further comprising: forming a second inorganic material layer covering the substrate and the thin film transistor before forming the organic material layer, etching the first inorganic material layer and the second inorganic material layer together, and making the drain electrode exposed through the first inorganic material layer and the second inorganic material layer.

6. The method of manufacturing the array substrate in claim 5, wherein the second inorganic material layer is silicon nitride.

7. The method of manufacturing the array substrate in claim 1, wherein the organic material layer is an organic photo resist.

* * * * *